United States Patent
Hong et al.

(10) Patent No.: US 10,685,714 B2
(45) Date of Patent: Jun. 16, 2020

(54) MEMORY DEVICE FOR PERFORMING A SELECTIVE ERASE OPERATION AND MEMORY SYSTEM HAVING THE SAME

(71) Applicant: SK hynix Inc., Gyeonggi-do (KR)

(72) Inventors: Ji Man Hong, Gyeonggi-do (KR); Tae Hoon Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/168,380

(22) Filed: Oct. 23, 2018

(65) Prior Publication Data

US 2019/0287625 A1    Sep. 19, 2019

(30) Foreign Application Priority Data

Mar. 16, 2018  (KR) .......................... 10-2018-0031089

(51) Int. Cl.
*G11C 16/16*  (2006.01)
*G11C 16/08*  (2006.01)
*G11C 16/34*  (2006.01)
*G11C 16/04*  (2006.01)
*G11C 11/56*  (2006.01)

(52) U.S. Cl.
CPC .......... *G11C 16/16* (2013.01); *G11C 11/5635* (2013.01); *G11C 16/0483* (2013.01); *G11C 16/08* (2013.01); *G11C 16/3445* (2013.01)

(58) Field of Classification Search
CPC ..... G11C 16/16; G11C 16/08; G11C 16/3445; G11C 16/0483; G11C 11/5635
See application file for complete search history.

(56) References Cited

U.S. PATENT DOCUMENTS

| 7,551,492 B2* | 6/2009 | Kim | G11C 8/08 365/185.17 |
| 2007/0183223 A1* | 8/2007 | Aritome | G11C 16/0483 365/185.29 |
| 2012/0269020 A1* | 10/2012 | Park | G11C 11/5628 365/218 |
| 2014/0063938 A1* | 3/2014 | Oh | H01L 27/11524 365/185.02 |
| 2016/0141043 A1* | 5/2016 | Lee | G11C 16/16 365/185.11 |
| 2016/0343454 A1* | 11/2016 | Pachamuthu | G11C 29/025 |

FOREIGN PATENT DOCUMENTS

| KR | 1020130035553 | 4/2013 |
| KR | 1020150129940 | 11/2015 |

* cited by examiner

*Primary Examiner* — Ajay Ojha
(74) *Attorney, Agent, or Firm* — IP & T Group LLP

(57) ABSTRACT

Provided herein may be a memory device and a memory system including the memory device. The memory device may include a memory block including a plurality of memory cells, a peripheral circuit configured to perform a selective erase operation on the memory cells, and control logic configured to control, during the selective erase operation, the peripheral circuit to apply an erase allowable voltage to a selected word line among a plurality of word lines in the memory block, apply an erase voltage to a selected string among a plurality of strings in the memory block, and float unselected word lines and unselected strings.

12 Claims, 12 Drawing Sheets

MEMORY DEVICE FOR PERFORMING A SELECTIVE ERASE OPERATION AND MEMORY SYSTEM HAVING THE SAME

CROSS-REFERENCE TO RELATED APPLICATION

The present application claims priority under 35 U.S.C. § 119(a) to Korean patent application number 10-2018-0031089, filed on Mar. 16, 2018, which is incorporated herein by reference in its entirety.

BACKGROUND

1. Field of Invention

Various embodiments of the present disclosure generally relate to a memory device and a memory system having the memory device. Particularly, the embodiments relate to a memory device capable of selectively erasing memory cells and a memory system having such memory device.

2. Description of the Related Art

Memory systems may include a memory device and a memory controller.

The memory device may store data or output the stored data, under control of the memory controller. For example, the memory device is implemented as a volatile memory device in which data stored therein is lost when power is turned off, or a nonvolatile memory device which can retain data stored therein even when power supply is interrupted.

The memory controller may control data communication between a host and the memory device.

The host may communicate with the memory system using an interface protocol such as a peripheral component interconnect-express (PCI-e or PCIe) protocol, an advanced technology attachment (ATA) protocol, an serial ATA (SATA) protocol, a parallel ATA (PATA) protocol, or an serial attached SCSI (SAS) protocol. The interface protocol between the host and the memory system is not limited to the above-mentioned examples. For instance, the host also may communicate with the memory system using various interfaces such as a universal serial bus (USB), a multi-media card (MMC), an enhanced small disk interface (ESDI), and integrated drive electronics (IDE).

SUMMARY

Various embodiments of the present disclosure are directed to a memory device capable of selectively erasing memory cells, and a memory system having the memory device.

An embodiment of the present disclosure may provide for a memory device including a memory block including a plurality of memory cells, a peripheral circuit configured to perform a selective erase operation on the memory cells, and control logic configured to control, during the selective erase operation, the peripheral circuit to apply an erase allowable voltage to a selected word line of a plurality of word lines and float unselected word lines.

In an embodiment, the memory block may include a plurality of strings coupled between bit lines and a source line, and each of the strings may include a drain select transistor, a plurality of memory cells, and a source select transistor.

In an embodiment, a positive voltage may be applied to the source line, and an erase voltage may be applied to the bit lines.

An embodiment of the present disclosure may provide for a memory device including a memory block including a plurality of memory cells, a peripheral circuit configured to perform a selective erase operation on the memory cells, and control logic configured to control, during the selective erase operation, the peripheral circuits to apply an erase voltage to a selected string of a plurality of strings in the memory block and float unselected strings.

An embodiment of the present disclosure may provide for a memory device including a memory block including a plurality of memory cells, a peripheral circuit configured to perform a selective erase operation on the memory cells, and control logic configured to control, during the selective erase operation, the peripheral circuit to apply an erase allowable voltage to a selected word line among a plurality of word lines in the memory block, apply an erase voltage to a selected string among a plurality of strings in the memory block, and float unselected word lines and unselected strings.

An embodiment of the present disclosure may provide for a memory system including a memory device including a memory block, and a memory controller configured to output a select erase command and an address of a selected memory cell, among a plurality of memory cells in the memory block, wherein the memory device is configured to perform a selective erase operation according to the select erase command and the address, and inhibit erasure of unselected memory cells by floating some word lines and strings, among all word lines and strings, in the memory block.

An embodiment of the present disclosure may provide for a memory system including a memory controller configured to output select erase information, and a memory device including a plurality of memory blocks, each of which includes a plurality of circuit areas, the memory device configured to receive the select erase information, and perform a selective erase operation on at least one memory block, among the plurality of memory blocks, based on the select erase information, by applying a set voltage to a select circuit area, among the plurality of circuit areas of the at least one memory block, and float a voltage of at least one non-selected circuit area among the plurality of areas.

In an embodiment, the select erase information may comprise a select erase command and an address of the select circuit area.

In an embodiment, the plurality of circuit areas may include at least one of a plurality of strings, a plurality of word lines, and a plurality of memory cells.

DETAILED DESCRIPTION

Advantages and features of the present disclosure, and methods for achieving the same will be described in the context of various embodiments in detail together with the accompanying drawings. However, elements and features of the present disclosure may be configured or arranged differently than disclosed herein. Thus, the present invention is not limited to the following embodiments. Rather, these embodiments are provided so that the present disclosure is thorough and complete and fully conveys the disclosure to those skilled in the art. It is further noted that, throughout the specification, reference to "an embodiment," "another embodiment," or the like is not necessarily to only one embodiment, and different references to any such phrase are not necessarily to the same embodiment(s).

It is also noted that in this specification, "connected/coupled" refers to one component not only directly coupling another component but also indirectly coupling another component through one or more intermediate components. In the specification, when an element is referred to as "comprising" or "including" a component, it does not preclude the presence or addition of one or more other components but may further include such other component(s), unless the context clearly indicates otherwise.

Various embodiments of the present disclosure will be described with reference to the accompanying drawings.

Figure 1:
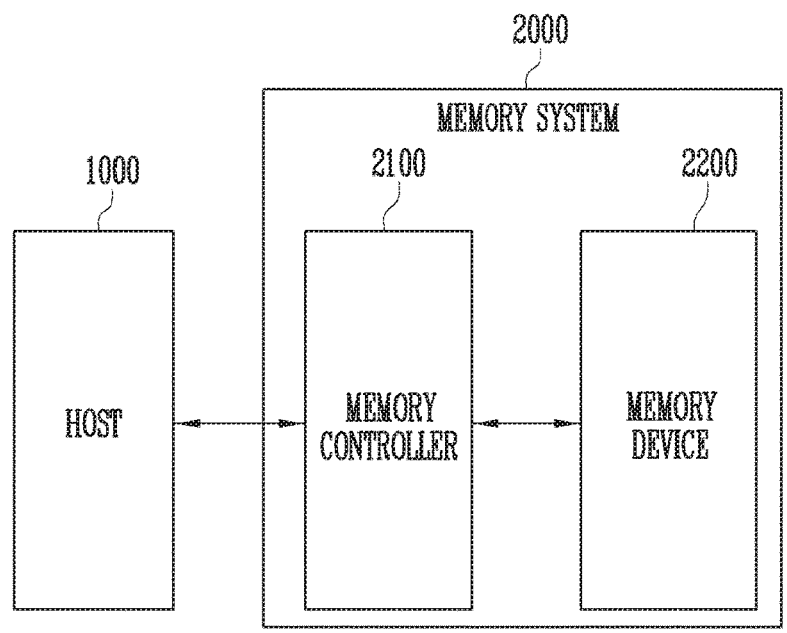
FIG. 1 is a diagram illustrating a memory system in accordance with an embodiment of the present disclosure.

FIG. 1 is a diagram illustrating a memory system 2000 in accordance with an embodiment of the present disclosure.

Referring to FIG. 1, the memory system 2000 may include a memory device 2200 configured to store data, and a memory controller 2100 configured to control the memory device 2200 under control of a host 1000.

The host 1000 may communicate with the memory system 2000 using an interface protocol such as a peripheral component interconnect-express (PCI-e or PCIe) protocol, an advanced technology attachment (ATA) protocol, a serial ATA (SATA) protocol, a parallel ATA (PATA) protocol, or a serial attached SCSI (SAS) protocol. The interface protocol between the host 1000 and the memory system 2000 is not limited to the above-described examples; alternatively, one of other interface protocols such as a universal serial bus (USB), a multi-media card (MMC), an enhanced small disk interface (ESDI), or integrated drive electronics (IDE) may be used.

The memory controller 2100 may control the overall operation of the memory system 2000 and data exchange between the host 1000 and the memory device 2200. More specifically, the memory controller 2100 may translate received information and store or output the translated information so that a command, an address, and data can be communicated between the host 1000 and the memory device 2200. For instance, during a program operation, the memory controller 2100 may transmit a command, an address, and data to the memory device 2200.

The memory controller 2100 may control the memory device 2200 to perform a selective erase operation on memory cells included in a memory block of the memory device 2200. For example, to perform an erase operation on one or more target cells to be erased among the memory cells in a memory block, the memory controller 2100 may transmit a select erase command and an address of the target cell(s) to be erased to the memory device 2200.

The target cell(s) to be erased may be at least one of memory cells included in a memory block. In an embodiment, all or some memory cells included in a selected page may be target cells to be erased. In another embodiment, all or some memory cells included in a selected string may be target cells to be erased. In still another embodiment, a memory cell included in common in a selected page and a selected string may be a target cell to be erased.

A target cell to be erased may be a memory cell having an erased state. More particularly, a target cell to be erased may be a memory cell which is in an erased state and has a threshold voltage exceeding an allowed threshold voltage.

The target cell(s) to be erased may be selected in various ways. In some embodiments, the target cell(s) to be erased may be selected according to data read from the corresponding memory block, or may be selected from among memory cells (e.g., fast cells), the threshold voltages of which rapidly increase. For instance, the memory controller 2100 may perform a read operation on a specific page or the entirety of a memory block to check threshold voltage distributions of the corresponding memory cells. Then, the memory controller 2100 may select, as a target cell to be erased, a memory cell the threshold voltage of which exceeds an allowed threshold voltage among memory cells having an erased state. Here, a read voltage may be set to a voltage level less than the allowed threshold voltage.

The memory device 2200 may perform an operation based on a command received from the memory controller 2100. Specifically, the memory device 2200 may receive a select erase command, a program command, a read command, and a normal erase command from the memory controller 2100. For instance, the memory device 2200 may perform an erase operation on the entirety of a selected memory block in response to a normal erase command and an address. Alternatively, the memory device 2200 may perform an erase operation on target cell(s) to be erased, i.e., selected memory cell(s), included in a selected memory block in response to a select erase command and an address.

During a selective erase operation, the memory device 2200 may float unselected word lines and unselected strings such that unselected memory cells are not erased.

Figure 2:
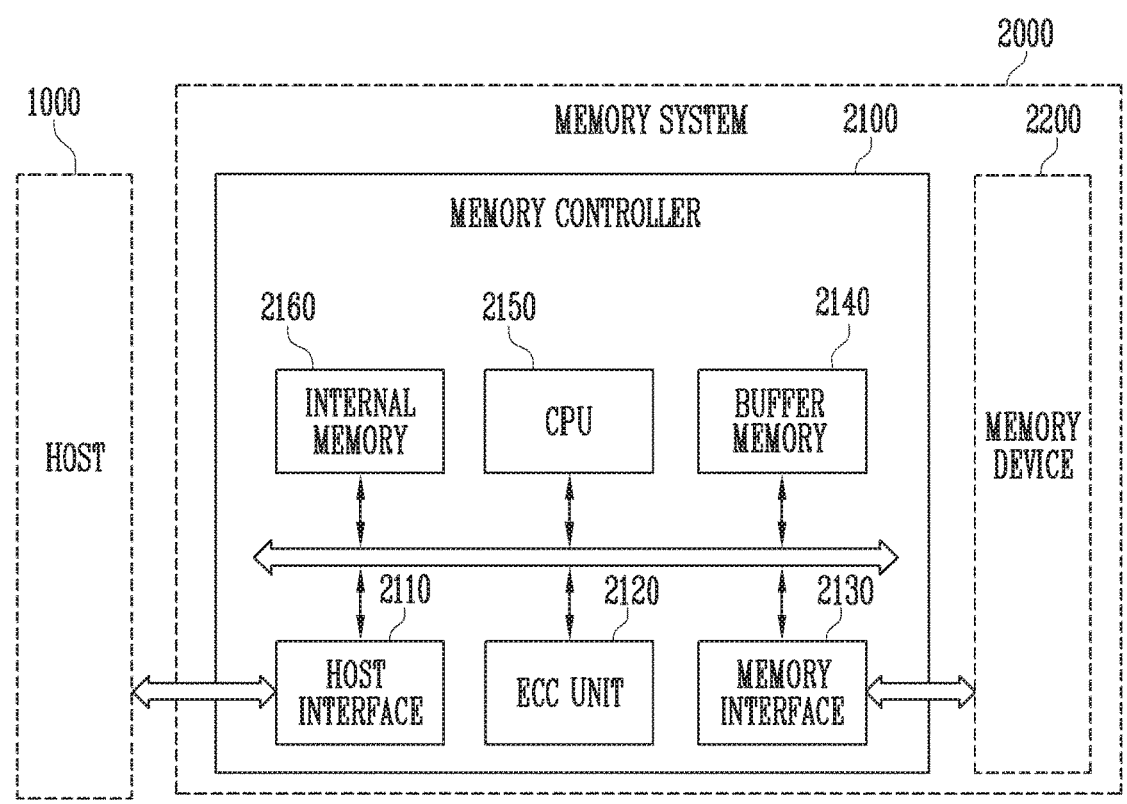
FIG. 2 is a diagram illustrating a memory controller in accordance with an embodiment of the present disclosure.

FIG. 2 is a diagram illustrating a memory controller in accordance with an embodiment of the present disclosure, for example, a memory controller 2100 shown in FIG. 1.

Referring to FIG. 2, the memory controller 2100 may include a host interface 2110, an error correcting code (ECC) unit 2120, a memory interface 2130, a buffer memory 2140, a central processing unit (CPU) 2150, and an internal memory 2160. The host interface 2110, the ECC unit 2120, the memory interface 2130, the buffer memory 2140, and the internal memory 2160 may be controlled by the CPU 2150.

The host interface 2110 may perform data exchange with the host 1000 using a communication protocol.

The ECC unit 2120 may detect an error during a program operation or a read operation, and correct the detected error.

The memory interface 2130 may communicate with the memory device 2200 using a communication protocol.

The buffer memory 2140 may temporarily store data while the memory controller 2100 controls the memory device 2200. For example, data received from the host 1000 may be temporarily stored in the buffer memory 2140 until the program operation is completed. During a read operation, data read from the memory device 2200 may be temporarily stored in the buffer memory 2140. In an embodiment, the buffer memory 2140 may be disposed externally to the memory controller 2100.

The CPU 2150 may perform various operations or generate a command and an address so as to control the memory device 2200. For example, the CPU 2150 may generate various commands needed for a program operation, a read operation, an erase operation, a suspend operation, and copyback operations.

To perform an erase operation on a selected memory cell, among memory cells included in a memory block, the CPU 2150 may generate a select erase command and an address of the selected memory cell. For example, the CPU 2150 may generate a select erase command when a select erase request is received from the host 1000 or during a background operation which is autonomously performed by the memory system 2000.

The internal memory 2160 may be used as a storage for storing various information needed for the operation of the memory controller 2100. The internal memory 2160 may include a map table. For example, physical-to-logical address information and logical-to-physical address information may be stored in the map table.

Figure 3:
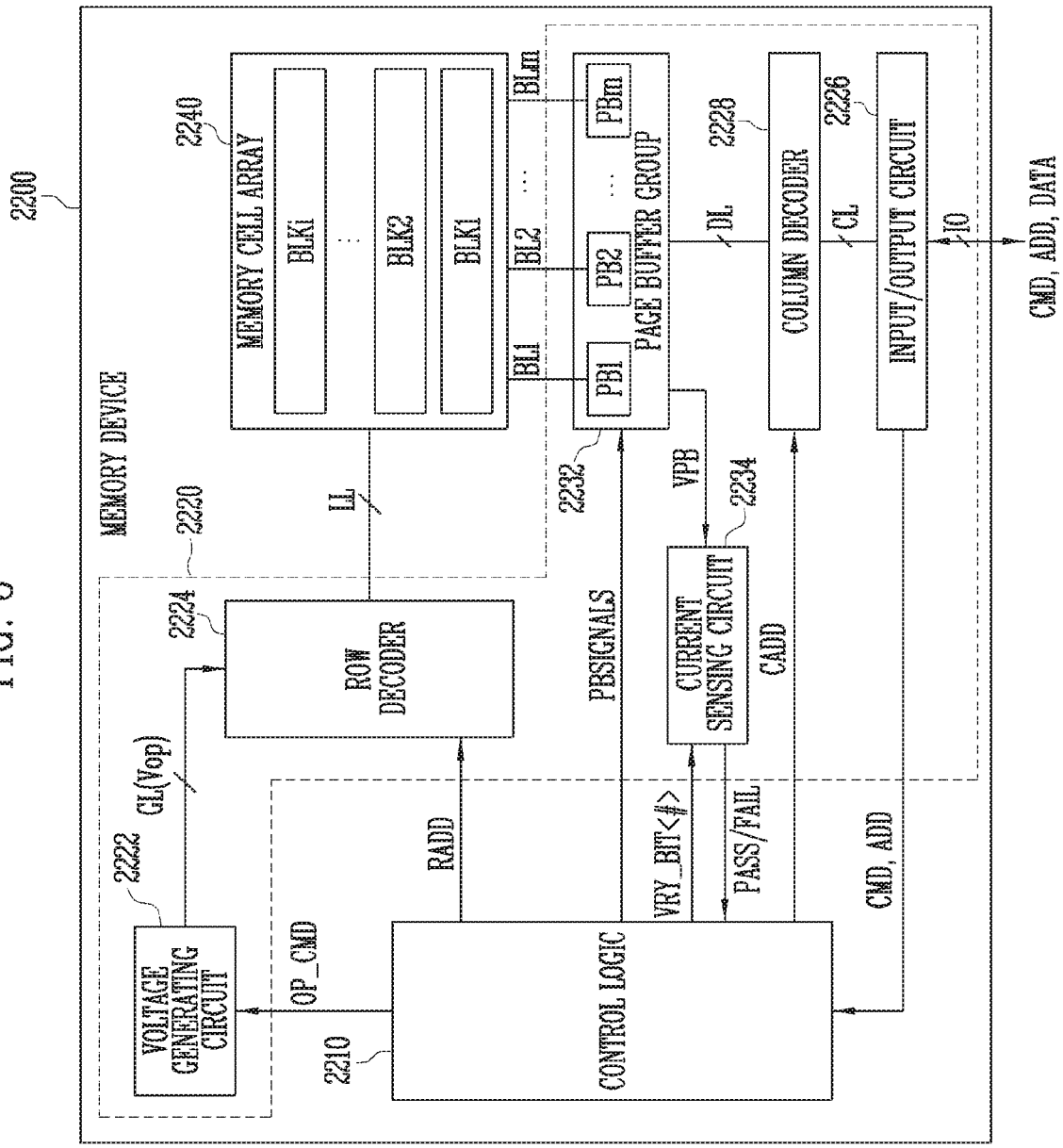
FIG. 3 is a diagram illustrating a memory device in accordance with an embodiment of the present disclosure.

FIG. 3 is a diagram illustrating a memory device in accordance with an embodiment of the present disclosure, for example, the memory device 2200 shown in FIGS. 1 and 2.

Referring to FIG. 3, the memory device 2200 may include control logic 2210, a peripheral circuit 2220, and a memory cell array 2240. The memory cell array 2240 may include a plurality of memory blocks BLK1 to BLKi. The peripheral circuit 2220 may include a voltage generating circuit 2222, a row decoder 2224, an input/output circuit 2226, a column decoder 2228, a page buffer group 2232, and a current sensing circuit 2234.

The control logic 2210 may control the peripheral circuit 2220 under control of the memory controller 2100 shown in FIG. 2. The control logic 2210 may control the peripheral circuit 2220 in response to a command CMD and an address ADD which are received from the memory controller 2100 through the input/output circuit 2226. For example, the control logic 2210 may output an operating signal OP_CMD, a row address RADD, page buffer control signals PBSIGNALS, and an allowable bit VRY_BIT<#> in response to the command CMD and the address ADD. The control logic 2210 may determine whether a verify operation has passed or failed, in response to a pass signal PASS or a fail signal FAIL received from the current sensing circuit 2234.

When a select erase command and an address are received, the control logic 2210 may control the peripheral circuit 2220 to perform an erase operation on selected memory cell(s), among memory cells in a selected memory block of the memory cell array 2240. For example, the control logic 2210 may control the peripheral circuit 2220 to apply an erase allowable voltage (e.g., 0 V) to a selected word line and apply an erase voltage (e.g., a positive voltage) to a bit line coupled to a selected string.

When an erase operation is performed on selected memory cell(s), the control logic 2210 may control the peripheral circuit 2220 to float unselected word lines and unselected strings, thus preventing the threshold voltages of unselected memory cells from reducing. For example, the control logic 2210 may reduce only the threshold voltages of the selected memory cell(s) by controlling the peripheral circuit 2220 such that unselected strings among bit lines BL1 to BLm coupled to the memory block float.

The peripheral circuit 2220 may perform a selective erase operation on memory cells in a selected memory block of the memory cell array 2240. For example, the peripheral circuit 2220 may perform an erasing operation for erasing selected memory cell(s) in a selected memory block of the memory cell array 2240, under control of the control logic 2210.

Furthermore, the peripheral circuit 2220 may perform a program operation for storing data to the memory cell array 2240, a read operation for outputting the data stored in the memory cell array 2240, or an erase operation for erasing the data stored in the memory cell array 2240.

The voltage generating circuit 2222 may generate various operating voltages Vop to be used for the program operation, the read operation, or the erase operation in response to an operating signal OP_CMD received from the control logic 2210. For example, the voltage generating circuit 2222 may transmit a program voltage, a verify voltage, a pass voltage, a compensation program voltage, a read voltage, an erase voltage, and a turn-on voltage to the row decoder 2224 through global lines GL. In addition, the voltage generating circuit 2222 may float some of the global lines GL in response to the operating signal OP_CMD.

The row decoder 2224 may transmit, in response to a row address RADD received from the control logic 2210, operating voltages Vop to local lines LL coupled to a selected one of the memory blocks included in the memory cell array 2240. The local lines LL may include local word lines, local drain select lines, and local source select lines. In addition, the local lines LL may include various lines such as source lines coupled to the memory blocks.

The input/output circuit 2226 may transmit, to the control logic 2210, a command CMD and an address ADD received from an external device, for example, the memory controller 2100 of FIG. 2, through input/output lines IO, or may exchange data DATA with the column decoder 2228.

The column decoder 2228 may transmit data between the input/output circuit 2226 and the page buffer group 2232 in response to a column address CADD received from the control logic 2210. For example, the column decoder 2228 may exchange data with page buffers PB1 to PBm through data lines DL or exchange data with the input/output circuit 2226 through column lines CL.

The page buffer group 2232 may be coupled to the bit lines BL1 to BLm coupled in common to the memory blocks BLK1 to BLKi. The page buffer group 2232 may include the plurality of page buffers PB1 to PBm coupled to the bit lines BL1 to BLm. For example, a single page buffer may be coupled to each bit line. The page buffers PB1 to PBm may operate in response to page buffer control signals PBSIGNALS received from the control logic 2210. During a program operation, the page buffers PB1 to PBm may temporarily store program data received from the memory controller 2100 through the input/output (IO) lines, the column lines CL and the data lines DL, and adjust voltages to be applied to the bit lines BL1 to BLm according to the program data. During a read operation, the page buffers PB1 to PBm may temporarily store data received from the memory cell array 2240 through the bit lines BL1 to BLm or sense voltages or current of the bit lines BL1 to BLm.

During a read or verify operation, the current sensing circuit 2234 may generate reference current in response to an allowable bit VRY_BIT<#> received from the control logic 2210, and may compare a sensing voltage VPB received from the page buffer group 2232 with a reference voltage generated by the reference current and output a pass signal PASS or a fail signal FAIL.

The memory cell array 2240 may include the plurality of memory blocks BLK1 to BLKi configured to store data. User data and various information needed for operations of the memory device 2200 may be stored in the memory blocks BLK1 to BLKi. The memory blocks BLK1 to BLKi may be embodied in a two-dimensional structure or a three-dimensional structure, and have the same configuration.

Figure 4:
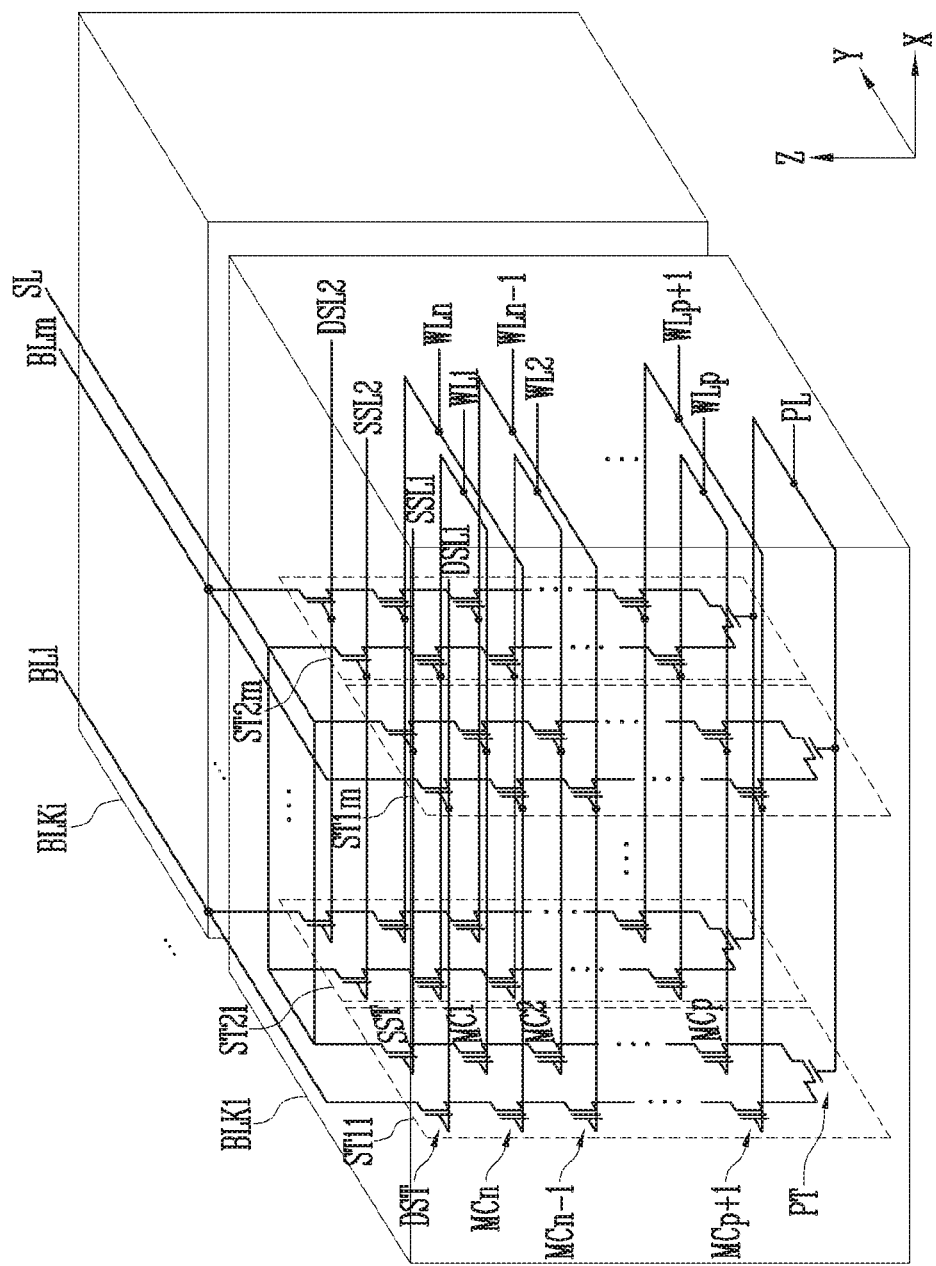
FIG. 4 is a diagram illustrating a memory block having a three-dimensional structure in accordance with an embodiment of the present disclosure.

FIG. 4 is a diagram illustrating a memory block having a three-dimensional structure in accordance with an embodiment of the present disclosure.

Referring to FIG. 4, a memory cell array 2240 of FIG. 3 may include a plurality of memory blocks BLK1 to BLKi, each of which may be configured the same. Thus, the first memory block BLK1 will be described by way of example. The first memory block BLK1 may include a plurality of strings ST11 to ST1m and ST21 to ST2m. In an embodiment, each of the strings ST11 to ST1m and ST21 to ST2m may be formed in a 'U' shape. In the first memory block BLK1, m strings may be arranged in a row direction (i.e. an X direction). Although FIG. 4 illustrates that two strings are arranged in a column direction (i.e., a Y direction), this is only for clarity of illustration. Alternatively, three or more strings may be arranged in the column direction (the Y direction).

Each of the strings ST11 to ST1m and ST21 to ST2m may include at least one source select transistor SST, first to n-th memory cells MC1 to MCn, a pipe transistor PT, and at least one drain select transistor DST.

The source and drain select transistors SST and DST and the memory cells MC1 to MCn may have structures similar to each other. For example, each of the source and drain select transistors SST and DST and the memory cells MC1 to MCn may include a channel layer, a tunnel insulating layer, a charge trap layer, and a blocking insulating layer. For example, a pillar for providing the channel layer may be provided in each string. In an embodiment, a pillar for providing at least one of the channel layer, the tunnel insulating layer, the charge trap layer, and the blocking insulating layer may be provided in each string.

The source select transistor SST of each string may be coupled between the source line SL and the memory cells MC1 to MCp.

In an embodiment, source select transistors of strings arranged in the same row may be coupled to a source select line extending in the row direction. Source select transistors of strings arranged in different rows may be coupled to different source select lines. In FIG. 4, source select transistors of the strings ST11 to ST1m in a first row may be coupled to a first source select line SSL1. Source select transistors of the strings ST21 to ST2m in a second row may be coupled to a second source select line SSL2.

In an embodiment, the source select transistors of the strings ST11 to ST1m and ST21 to ST2m may be coupled in common to a single source select line.

The first to n-th memory cells MC1 to MCn in each string may be coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp may be successively arranged in a vertical direction (i.e., a Z direction) and coupled in series to each other between the source select transistor SST and the pipe transistor PT. The p+1-th to n-th memory cells MCCp+1 to MCn may be successively arranged in the vertical direction (the Z direction) and coupled in series to each other between the pipe transistor PT and the drain select transistor DST. The first to p-th memory cells MC1 to MCp and the p+1-th to n-th memory cells MCp+1 to MCn may be coupled to each other through the pipe transistor PT. Gates of the first to n-th memory cells MC1 to MCn of each string may be respectively coupled to first to n-th word lines WL1 to WLn.

In an embodiment, at least one of the first to n-th memory cells MC1 to MCn may be used as a dummy memory cell. In the case where the dummy memory cell is provided, the voltage or the current of the corresponding string may be stably controlled. A gate of the pipe transistor PT of each string may be coupled to a pipeline PL.

The drain select transistor DST of each string may be coupled between the corresponding bit line and the memory cells MCp+1 to MCn. Strings arranged in the row direction may be coupled to corresponding drain select lines extending in the row direction. The drain select transistors of the strings ST11 to ST1m in the first row may be coupled to a first drain select line DSL1. The drain select transistors of the strings ST21 to ST2m in the second row may be coupled to a second drain select line DSL2.

Strings arranged in the column direction may be coupled to corresponding bit lines extending in the column direction. In FIG. 4, the strings ST11 and ST21 in a first column may be coupled to a first bit line BL1. The strings ST1m and ST2m in an m-th column may be coupled to an m-th bit line BLm.

Among the strings arranged in the row direction, memory cells coupled to the same word line may form one page. For example, memory cells coupled to the first word line WL1 in the strings ST11 to ST1m of the first row may form a single page. Memory cells coupled to the first word line WL1 in the strings ST21 to ST2m of the second row may form another single page. When any one of the drain select lines DSL1 and DSL2 is selected, strings arranged in the corresponding row may be selected. When any one of the word lines WL1 to WLn is selected, a corresponding single page may be selected from the selected strings.

Figure 5:
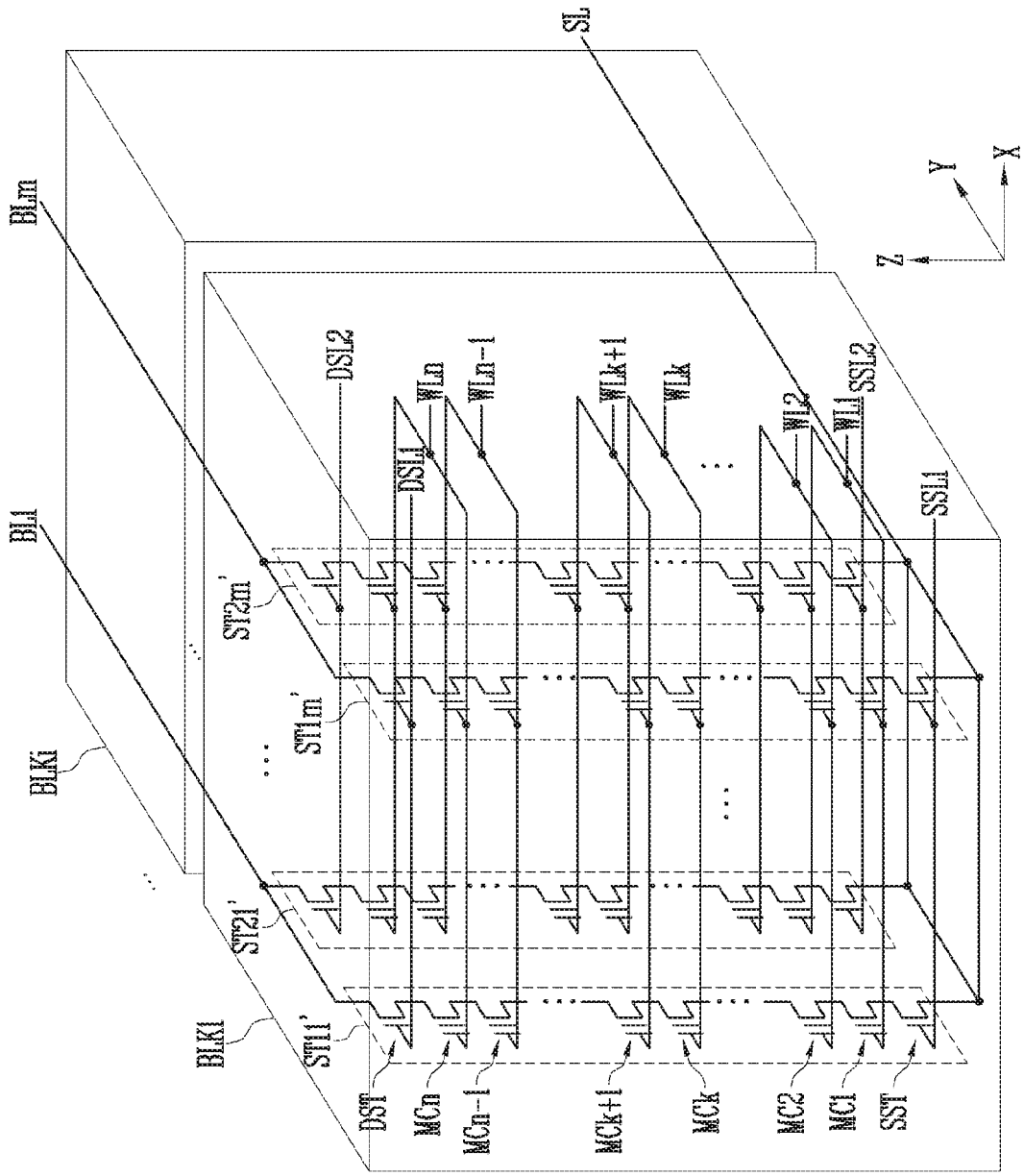
FIG. 5 is a diagram illustrating a memory block having a three-dimensional structure in accordance with an embodiment of the present disclosure.

FIG. 5 is a diagram illustrating a memory block having a three-dimensional structure in accordance with an embodiment of the present disclosure.

Referring to FIG. 5, a memory cell array 2240 of FIG. 3 may include a plurality of memory blocks BLK1 to BLKi, each of which may be configured in the same manner. Thus, the first memory block BLK1 will be described by way of example. The first memory block BLK1 may include a plurality of strings ST11' to ST1m' and ST21' to ST2m'. Each of the strings ST11' to ST1m' and ST21' to ST2m' may extend in a vertical direction (i.e., in a Z direction). In each memory block BLKi, m strings may be arranged in a row direction (i.e., in an X direction). Although FIG. illustrates that two strings are arranged in a column direction (i.e., in a Y direction), this is only for clarity of illustration. Alternatively, three or more strings may be arranged in the column direction (the Y direction).

Each of the strings ST11' to ST1m' and ST21' to ST2m' may include at least one source select transistor SST, first to n-th memory cells MC1 to MCn, and at least one drain select transistor DST.

The source select transistor SST of each string may be coupled between the source line SL and the memory cells MC1 to MCn. Source select transistors of strings arranged in the same row may be coupled to the same source select line. The source select transistors of the strings ST11' to ST1m' arranged in a first row may be coupled to a first source select line SSL1. The source select transistors of the strings ST21' to ST2m' arranged in a second row may be coupled to a second source select line SSL2. In an embodiment, the source select transistors of the strings ST11' to ST1m' and ST21' to ST2m' may be coupled in common to a single source select line.

The first to n-th memory cells MC1 to MCn in each string may be coupled in series between the source select transistor SST and the drain select transistor DST. Gates of the first to n-th memory cells MC1 to MCn may be respectively coupled to first to n-th word lines WL1 to WLn.

In an embodiment, at least one of the first to n-th memory cells MC1 to MCn may be used as a dummy memory cell. In the case where the dummy memory cell is provided, the voltage or the current of the corresponding string may be stably controlled. Thereby, the reliability of data stored in the first memory block BLK1 may be improved.

The drain select transistor DST of each string may be coupled between the corresponding bit line and the memory cells MC1 to MCn. Drain select transistors DST of strings arranged in the row direction may be coupled to corresponding drain select lines. The drain select transistors DST of the strings ST11' to ST1m' in the first row may be coupled to a first drain select line DSL1. The drain select transistors DST of the strings ST21' to ST2m' in the second row may be coupled to a second drain select line DSL2.

In other words, the first memory block BLK1 of FIG. 5 may have a circuit structure similar to that of the first memory block BLK1 of FIG. 4 except that a pipe transistor PT is excluded from each cell string.

Figure 6:
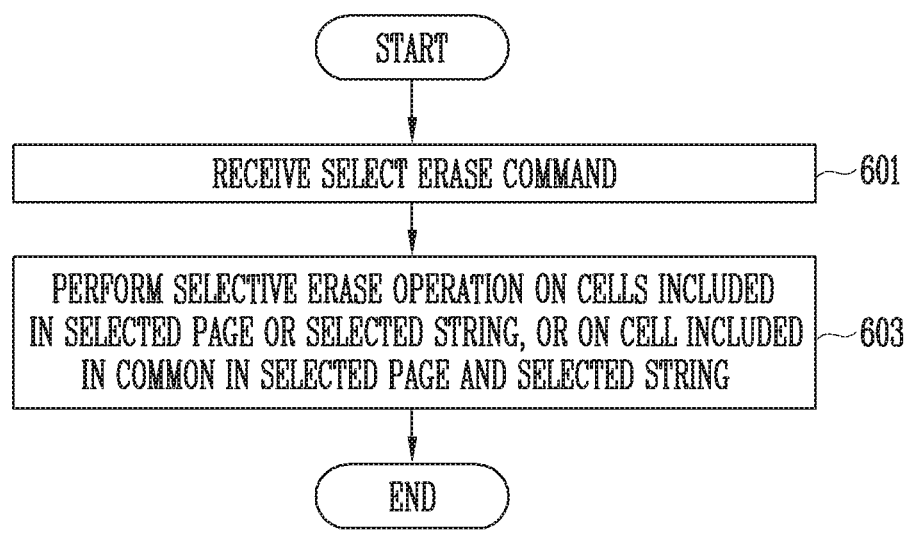
FIG. 6 is a flowchart describing a method of operating a memory device in accordance with an embodiment of the present disclosure.

FIG. 6 is a flowchart describing a method of operating the memory device in accordance with an embodiment of the present disclosure.

The embodiment to be described with reference to FIG. 6 may be applied to the memory device described with reference to FIGS. 1 to 5.

Referring to FIG. 6, at step 601, the memory device may receive a select erase command and an address from the memory controller. The memory controller may generate a select erase command when a select erase request is received from the host or when the memory system including the memory controller autonomously performs a background operation. The memory controller may transmit, along with the select erase command, an address of a target cell to be erased to the memory device.

At step 603, the memory device may perform a selective erase operation on memory cell(s) in a selected memory block in response to the received select erase command and the address. In other words, the memory device may perform an erase operation on selected memory cell(s) among the memory cells in the selected memory block.

When all memory cells in a selected page are target cells to be erased, the memory device may apply an erase allowable voltage (e.g., 0 V) to a selected word line and float unselected word lines, thus reducing the threshold voltages of the memory cells included in the selected page, and remaining the threshold voltages of memory cells included in unselected pages intact.

When all memory cells in a selected string are target cells to be erased, the memory device may apply an erase voltage (e.g., a positive voltage) to a bit line coupled to the selected string and float unselected strings, thus reducing the threshold voltages of the memory cells in the selected string, and maintaining the threshold voltages of memory cells in the unselected strings intact.

When a memory cell included in common in a selected page and a selected string is a target cell to be erased, the memory device may apply an erase allowable voltage (e.g., 0 V) to a selected word line and apply an erase voltage (e.g., a positive voltage) to a bit line coupled to the selected string. Here, the memory device may float unselected word lines and unselected strings to maintain the threshold voltages of memory cells in unselected pages and the unselected strings intact.

Figure 7:
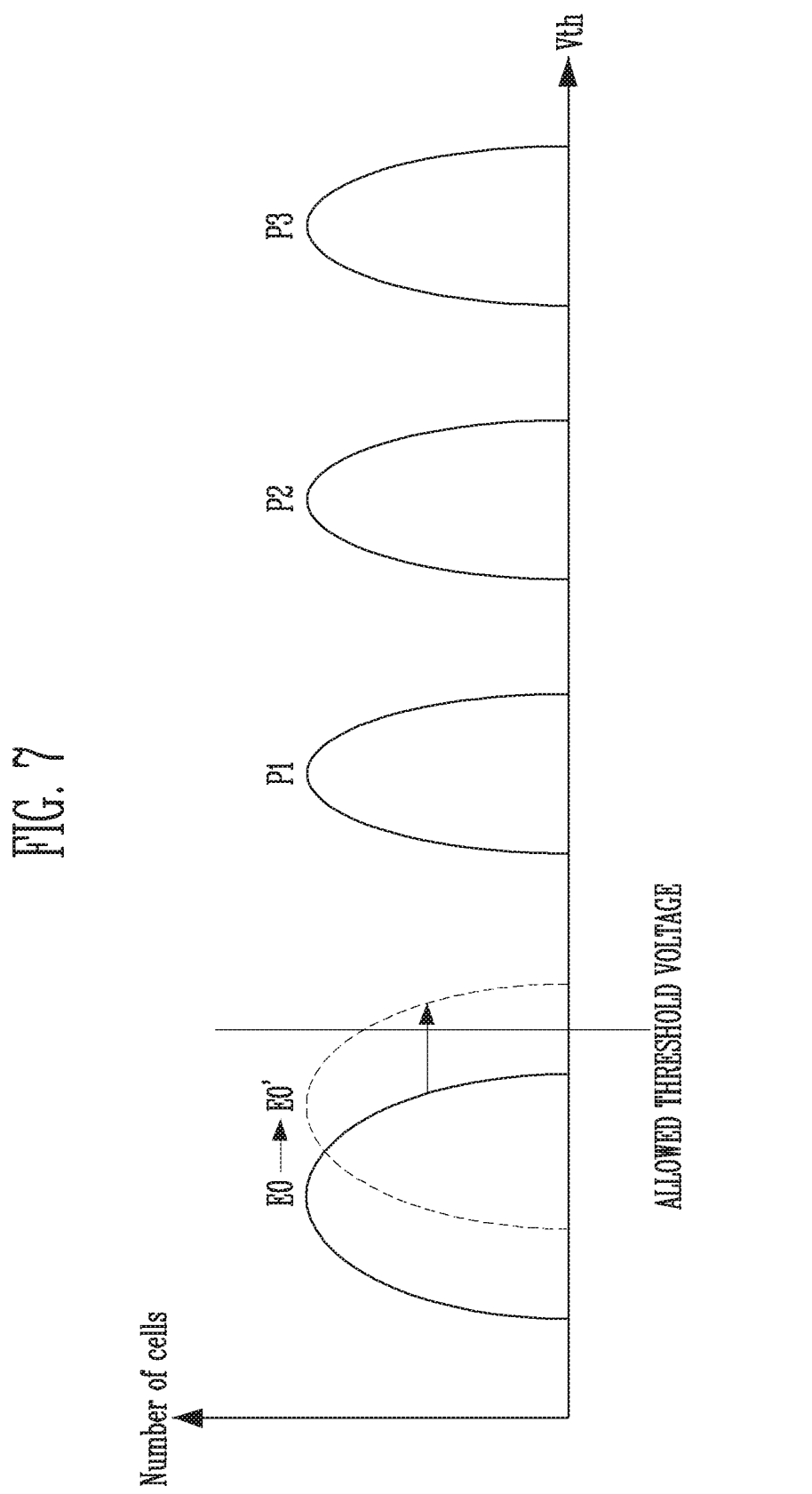
FIG. 7 is a diagram illustrating threshold voltage distributions of memory cells in accordance with an embodiment of the present disclosure.

FIG. 7 is a diagram illustrating threshold voltage distributions of memory cells in accordance with an embodiment of the present disclosure.

FIG. 7 illustrates threshold voltage distributions of memory cells, each of which is a multi-level cell (MLC). The memory cells may be programmed to an erase state E0, a first program state P1, a second program state P2, or a third program state P3.

Memory cells included in a memory block on which a program operation has been performed may have various threshold voltage distributions such as the erase state E0, the first program state P1, the second program state P2, and the third program state P3. If read operations are repeatedly performed on the programmed memory block, Interference or coupling may occur due to a read voltage and a pass voltage which are used in a read operation. Particularly, the threshold voltages of the memory cells that are in the erase state E0 may be increased by the influence of the read voltage and the pass voltage. If the threshold voltages of the memory cells that are in the erase state E0 exceed an allowed threshold voltage (as shown by E0'), a threshold voltage margin between the erase state E0' and the first program state P1 that is the program state having the lowest level among the program states may be reduced. In this case, during a read operation, a read error may occur, whereby the reliabilities of the memory device and the memory system including the memory device may be reduced.

Figure 8:
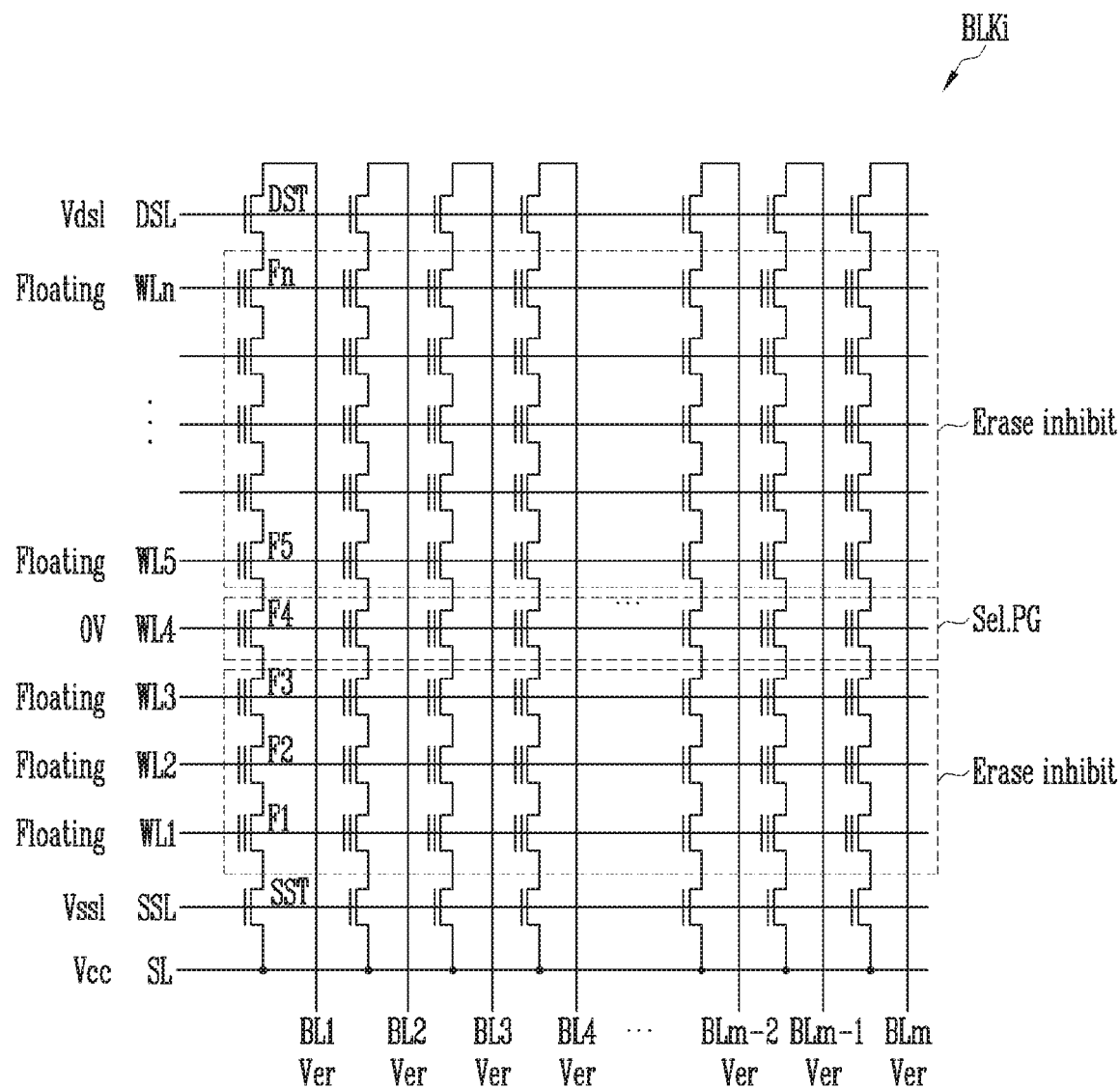
FIG. 8 is a diagram illustrating a selective erase operation in accordance with an embodiment of the present disclosure.

FIG. 8 is a diagram illustrating a selective erase operation for an exemplary block BLKi in accordance with an embodiment of the present disclosure.

Referring to FIG. 8, it is illustrated, by way of example, that all memory cells in a selected page Sel.PG of the block BLKi are selected as target cells to be erased, and memory cells in other pages are not selected as the target cells to be erased ("Erase inhibit").

The control logic 2210 may control the peripheral circuit 2220 such that an erase operation is performed on all of the memory cells included in the selected page Sel.PG. For example, an erase allowable voltage (e.g., 0 V) may be applied to a selected word line WL4 coupled to the selected page Sel.PG.

Here, the control logic 2210 may control the peripheral circuit 2220 such that word lines WL1 to WL3 and WL5 to WLn coupled to the unselected pages float to prevent the memory cells in the unselected pages from being erased.

In the embodiment described with reference to FIG. 8, because all of the memory cells in the selected page Sel.PG are the target cells to be erased, an erase voltage Ver may be applied to all of the bit lines BL1 to BLm. For example, the erase voltage Ver may be a positive voltage, e.g., greater than 0 V. For instance, the erase voltage Ver may be set to a value ranging from 15 V to 20 V. In the case where the erase operation is performed in an incremental step pulse erase (ISPE) manner, the erase voltage Ver to be applied to the bit lines BL1 to BLm may be increased in stages or steps.

Each of the drain select transistors DST and the source select transistors SST may be turned on or off depending on voltages Vdsl and Vssl to be applied thereto. To this end, a turn-on voltage or a turn-off voltage may be applied to the drain select line DSL and the source select line SSL. The turn-on voltage may be a positive voltage. The turn-off voltage may be less than the turn-on voltage, and may be, e.g., 0 V. A positive voltage Vcc may be applied to the source line SL.

Figure 9:
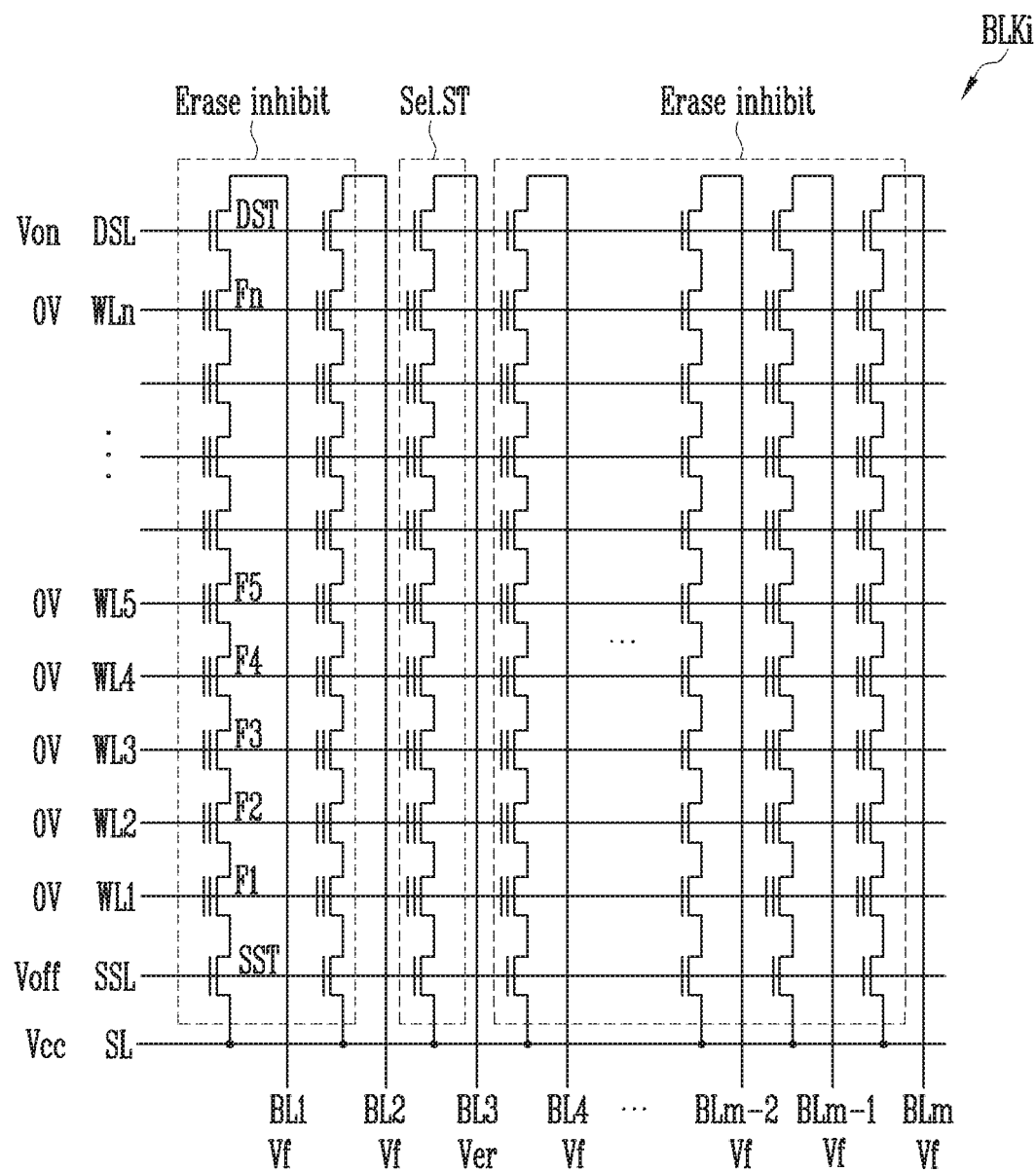
FIG. 9 is a diagram illustrating a selective erase operation in accordance with an embodiment of the present disclosure.

FIG. 9 is a diagram illustrating a selective erase operation for an exemplary block BLKi in accordance with an embodiment of the present disclosure.

FIG. 9, illustrates, as an example, that all memory cells in a selected string Sel.ST of the block BLKi are selected as target cells to be erased, and memory cells in other strings are not selected as the target cells to be erased ("Erase inhibit").

The control logic 2210 may control the peripheral circuit 2220 such that an erase operation is performed on all of the memory cells in the selected string Sel.ST. For example, an erase voltage Ver may be applied to the bit line BL3 coupled to the selected string Sel.ST.

Here, the control logic 2210 may control the peripheral circuit 2220 such that the unselected strings float to prevent the memory cells in the unselected strings from being erased.

In the embodiment described with reference to FIG. 9, because all of the memory cells in the selected string Sel.ST are the target cells to be erased, an erase allowable voltage may be applied to all of the word lines WL1 to WLn. For example, the erase allowable voltage may be 0 V. The erase voltage Ver may be applied to the bit line BL3 coupled to the selected string Sel.ST, and a floating voltage Vf may be applied to the bit lines BL1, BL2, and BL4 to BLm coupled to the unselected strings. For example, the floating voltage Vf may be set to a value greater than that of the erase voltage Ver. To prevent channel voltages of source strings from decreasing and increase channel voltages of the unselected strings, a positive voltage Vcc may be applied to the source line SL, and a turn-off voltage Voff may be applied to the source select line SSL. Here, a turn-on voltage Von may be applied to the drain select line DSL so that the erase voltage Ver applied to the selected bit line BL3 may be transmitted to the selected string Sel.ST. If the turn-of voltage Von is applied to the drain select line DSL, all of the drain select transistors DST coupled to the drain select line DSL may be turned on. In this case, if the floating voltage Vf applied to the unselected bit lines BL1, BL2, and BL4 to BLm is applied to the unselected strings, the channel voltages of the unselected strings may be increased. If the channel voltages of the unselected strings increase to threshold voltage levels of the drain select transistors DST, only the drain select transistors DST in the unselected strings may be turned off. Therefore, the unselected strings may float, whereby the memory cells in the unselected strings may not be erased.

Figure 10:
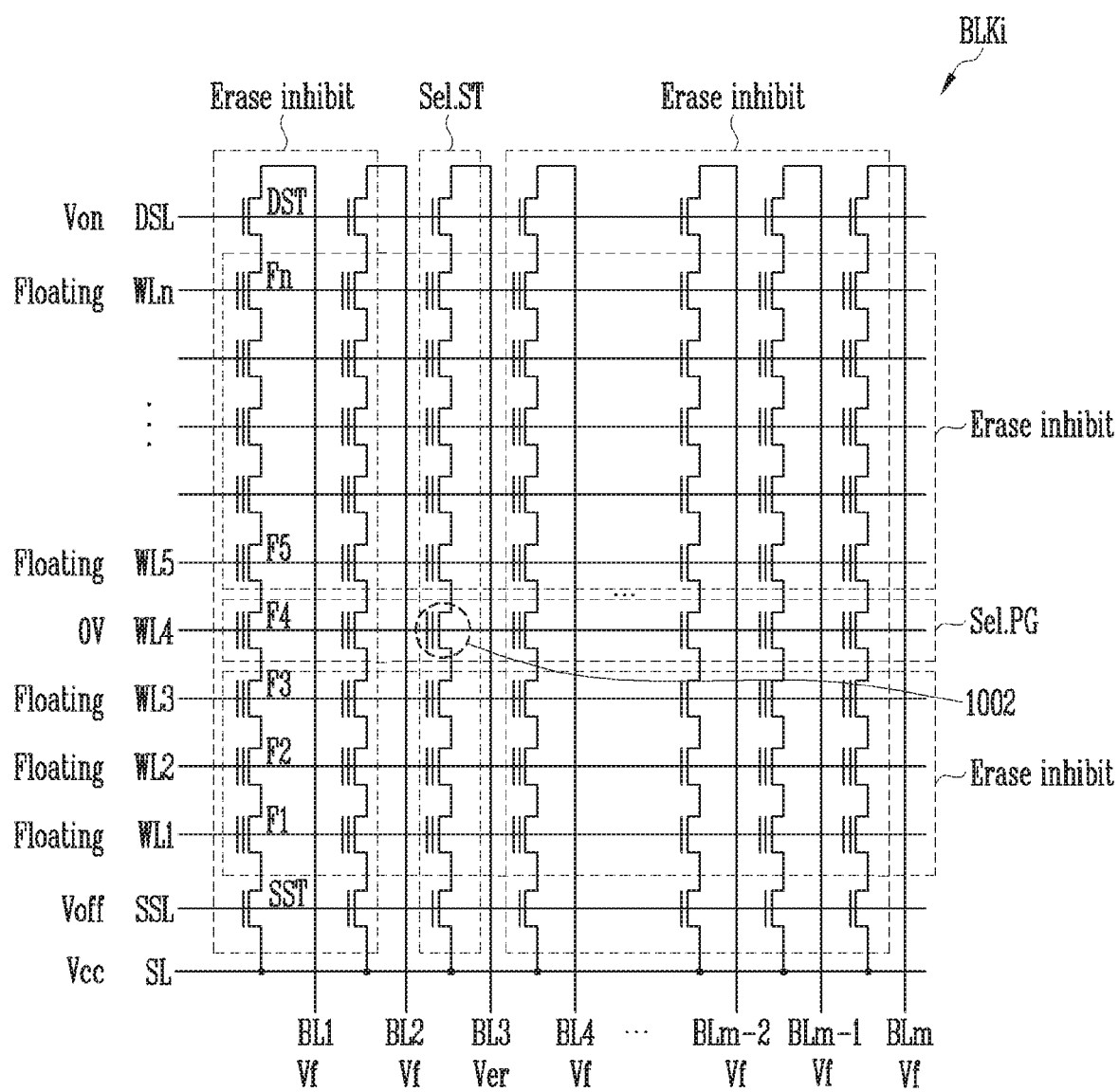
FIG. 10 is a diagram illustrating a selective erase operation in accordance with an embodiment of the present disclosure.

FIG. 10 is a diagram illustrating a selective erase operation for an exemplary block BLKi in accordance with an embodiment of the present disclosure.

FIG. 10, illustrates, as an example, In which a memory cell 1002 in common in a selected page Sel.PG and a selected string Sel.ST of the block BLKi is selected as a target cell to be erased, and the other memory cells are not selected as the target cell to be erased ("Erase inhibit"). In other words, FIG. 10 illustrates an embodiment that is essentially a combination of the embodiments described with reference to FIGS. 8 and 9.

The control logic 2210 may control the peripheral circuit 2220 such that an erase operation is performed on the selected memory cell 1002. For example, an erase allowable voltage (e.g., 0 V) may be applied to the selected word line WL4, and an erase voltage Ver may be applied to the bit line BL3 coupled to the selected string Sel.ST. Here, the control logic 2210 may control the peripheral circuit 2220 such that the unselected memory cells are prevented from being erased. For instance, the control logic 2210 may control the peripheral circuit 2220 such that the unselected word lines WL1 to WL3 and WL5 to WLn and the unselected strings float. To this end, a turn-off voltage Voff may be applied to the source select line SSL, and a turn-on voltage Von may be applied to the drain select line DSL. Furthermore, a floating voltage Vf may be applied to the bit lines BL1, BL2, and BL4 to BLm coupled to the unselected strings.

Figure 11:
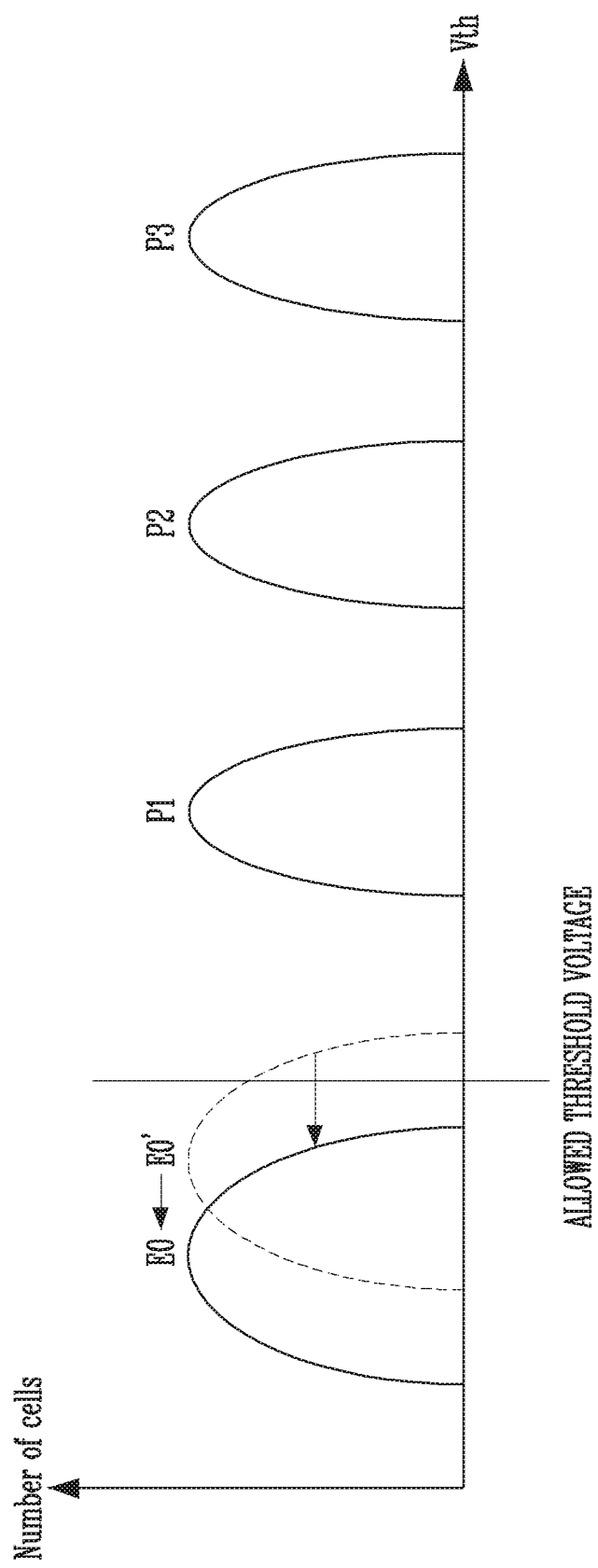
FIG. 11 is a diagram illustrating threshold voltage distributions of memory cells after a selective erase operation has been performed, in accordance with an embodiment of the present disclosure.

FIG. 11 is a diagram illustrating threshold voltage distributions of memory cells after a selective erase operation has been performed, in accordance with an embodiment of the present disclosure.

Referring to FIG. 11, if the selective erase operation is performed according to any of the above-mentioned embodiments, the threshold voltage(s) of the memory cell(s) on which the selective erase operation has been performed may be reduced. For example, memory cells having the erase state E0' that have exceeded the allowed threshold voltage may enter the normal erase state E0 by the selective erase operation.

Thereby, the threshold voltage margin between the erase state E0 and the first program state P1, which has the lowest voltage level among the program states, may be achieved. Therefore, the reliability of a read operation of the memory device may be improved, whereby the reliability of the memory system including the memory device may be enhanced.

Figure 12:
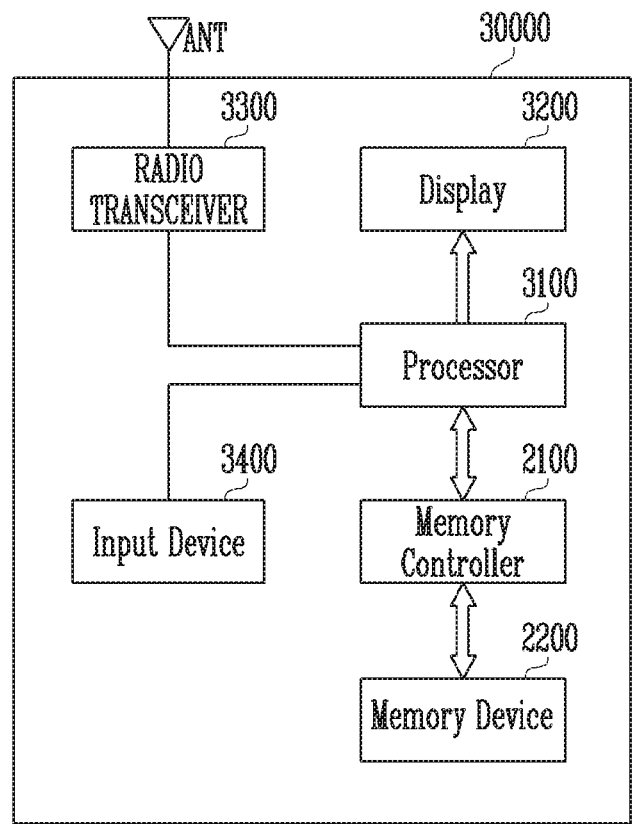
FIG. 12 is a diagram illustrating a memory system including a memory controller in accordance with an embodiment of the present disclosure.

FIG. 12 is a diagram illustrating a memory system 30000 including a memory controller in accordance with an embodiment of the present disclosure, for example, the memory controller 2100 shown in FIGS. 1 and 2.

Referring to FIG. 12, the memory system 30000 may be embodied in a cellular phone, a smartphone, a tablet personal computer (PC), a personal digital assistant (PDA) or a wireless communication device. The memory system 30000 may include a memory device 2200 and the memory controller 2100 capable of controlling the operation of the memory device 2200. The memory device 2200 shown in FIG. 12 may correspond to the memory device 2200 shown in FIGS. 1 and 2. The memory controller 2100 shown in FIG. 12 may correspond to the memory controller 2100 shown in FIGS. 1 and 2.

The memory controller 2100 may control a data access operation, e.g., a program operation, an erase operation, or a read operation, of the memory device 2200 under control of a processor 3100.

Data programmed in the memory device 2200 may be output through a display 3200 under control of the memory controller 2100.

A radio transceiver 3300 may transmit and receive radio signals through an antenna ANT. For example, the radio transceiver 3300 may convert a radio signal received through the antenna ANT into a signal capable of being processed in the processor 3100. Therefore, the processor 3100 may process a signal output from the radio transceiver 3300 and transmit the processed signal to the memory controller 2100 or the display 3200. The memory controller 2100 may transmit a signal processed by the processor 3100 to the memory device 2200. Furthermore, the radio transceiver 3300 may convert a signal output from the processor 3100 into a radio signal, and output the converted radio signal to an external device through the antenna ANT. An input device 3400 may be used to input a control signal for controlling the operation of the processor 3100 or data to be processed by the processor 3100. The input device 3400 may be embodied in a pointing device such as a touch pad and a computer mouse, a keypad or a keyboard. The processor 3100 may control the operation of the display 3200 such that data output from the memory controller 2100, data output from the radio transceiver 3300, or data output form the input device 3400 is output through the display 3200.

In an embodiment, the memory controller 2100 capable of controlling the operation of the memory device 2200 may be embodied as a part of the processor 3100 or a chip provided separately from the processor 3100.

Figure 13:
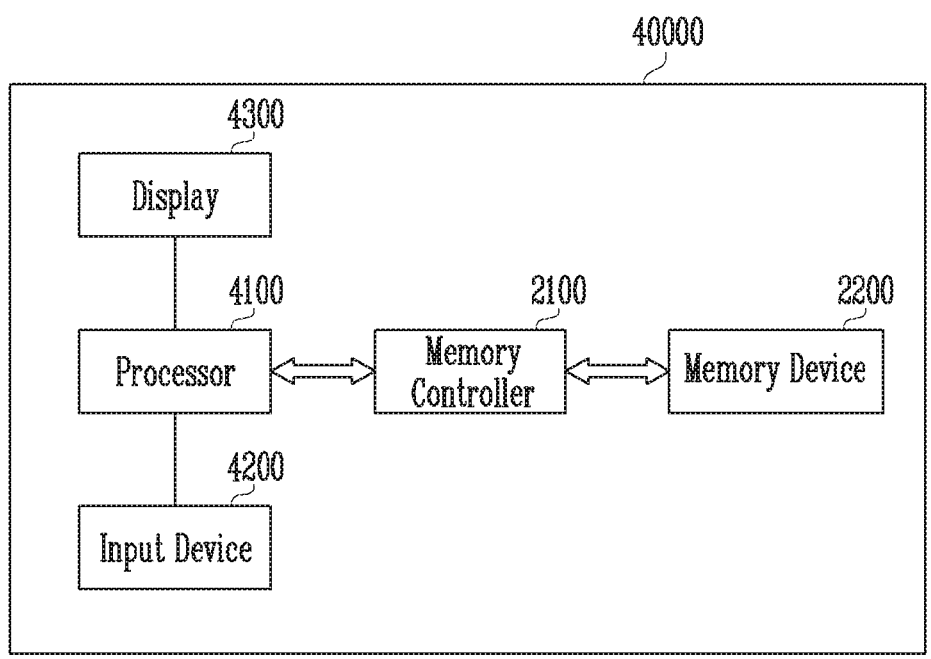
FIG. 13 is a diagram illustrating a memory system including a memory controller in accordance with an embodiment of the present disclosure.

FIG. 13 is a diagram illustrating a memory system 40000 including a memory controller in accordance with an embodiment of the present disclosure, for example, the memory controller 2100 shown in FIGS. 1 and 2.

Referring to FIG. 13, the memory system 40000 may be embodied in a personal computer (PC), a tablet PC, a net-book, an e-reader, a personal digital assistant (PDA), a portable multimedia player (PMP), an MP3 player, or an MP4 player.

The memory system 40000 may include a memory device 2200, and the memory controller 2100 capable of controlling a data processing operation of the memory device 2200. The memory device 2200 shown in FIG. 13 may correspond to the memory device 2200 shown in FIGS. 1 and 2. The memory controller 2100 shown in FIG. 13 may correspond to the memory controller 2100 shown in FIGS. 1 and 2.

A processor 4100 may output data stored in the memory device 2200 through a display 4300, according to data input from an input device 4200. For example, the input device 4200 may be embodied in a pointing device such as a touch pad or a computer mouse, a keypad, or a keyboard.

The processor 4100 may control the overall operation of the memory system 40000 and control the operation of the memory controller 2100. In an embodiment, the memory controller 2100 capable of controlling the operation of the memory device 2200 may be embodied as a part of the processor 4100 or a chip provided separately from the processor 4100.

Figure 14:
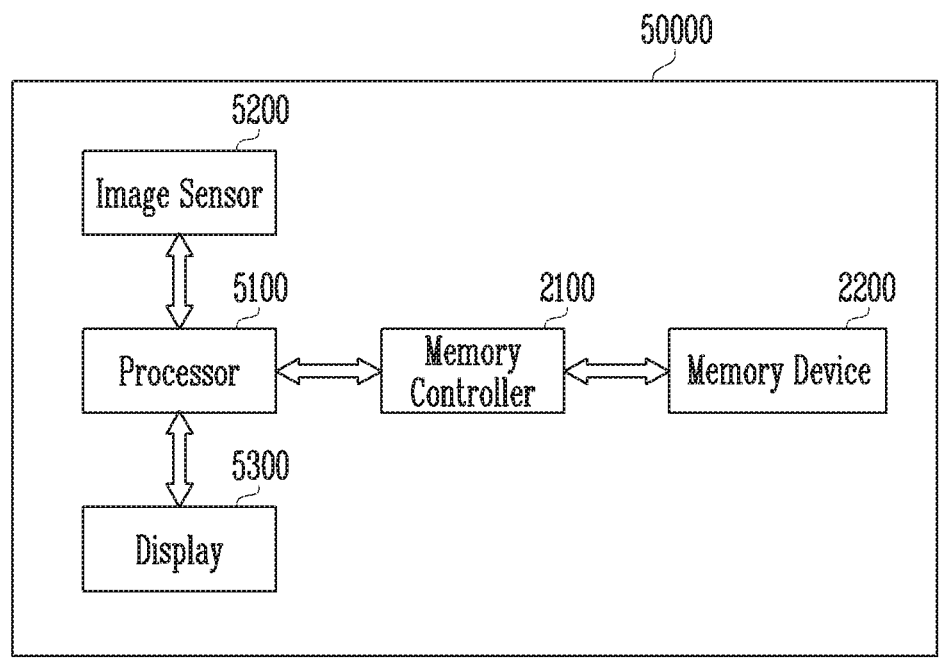
FIG. 14 is a diagram illustrating a memory system including a memory controller in accordance with an embodiment of the present disclosure.

FIG. 14 is a diagram illustrating a memory system 50000 including a memory controller in accordance with an embodiment of the present disclosure, for example, the memory controller 2100 shown in FIGS. 1 and 2.

Referring to FIG. 14, the memory system 50000 may be embodied in an image processing device, e.g., a digital camera, a portable phone provided with a digital camera, a smartphone provided with a digital camera, or a tablet personal computer (PC) provided with a digital camera.

The memory system 50000 may include a memory device 2200, and the memory controller 2100 capable of controller a data processing operation, e.g., a program operation, an erase operation, or a read operation, of the memory device 2200. The memory device 2200 shown in FIG. 14 may correspond to the memory device 2200 shown in FIGS. 1 and 2. The memory controller 2100 shown in FIG. 14 may correspond to the memory controller 2100 shown in FIGS. 1 and 2.

An image sensor 5200 of the memory system 50000 may convert an optical image into digital signals. The converted digital signals may be transmitted to a processor 5100 or the memory controller 2100. Under control of the processor 5100, the converted digital signals may be output through a display 5300 or stored to the memory device 2200 through the memory controller 2100. Data stored in the memory device 2200 may be output through the display 5300 under control of the processor 5100 or the memory controller 2100.

In an embodiment, the memory controller 2100 capable of controlling the operation of the memory device 2200 may be embodied as a part of the processor 5100 or a chip provided separately from the processor 5100.

Figure 15:
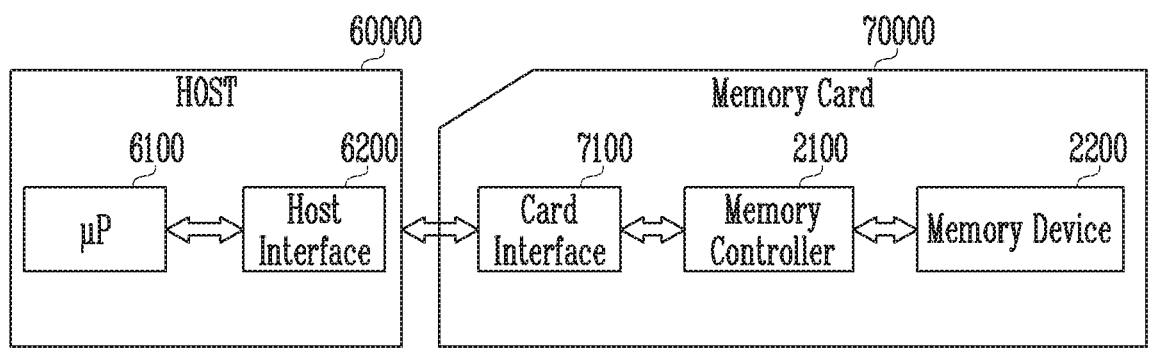
FIG. 15 is a diagram illustrating a memory system including a memory controller in accordance with an embodiment of the present disclosure.

FIG. 15 is a diagram illustrating a memory system 70000 Including a memory controller in accordance with an embodiment of the present disclosure, for example, the memory controller 2100 shown in FIGS. 1 and 2.

Referring to FIG. 15, the memory system 70000 may be embodied in a memory card or a smart card. The memory system 70000 may include the memory controller 2100, a memory device 2200, and a card interface 7100. The memory device 2200 shown in FIG. 15 may correspond to the memory device 2200 shown in FIGS. 1 and 2. The memory controller 2100 shown in FIG. 15 may correspond to the memory controller 2100 shown in FIGS. 1 and 2.

The controller 2100 may control data exchange between the memory device 2200 and the card interface 7100. In an embodiment, the card interface 7100 may be a secure digital (SD) card interface or a multi-media card (MMC) interface, but it is not limited thereto.

The card interface 7100 may interface data exchange between a host 60000 and the memory controller 2100 according to a protocol of the host 60000. In an embodiment, the card interface 7100 may support a universal serial bus (USB) protocol, and an interchip (IC)-USB protocol. Here, the card interface 7100 may refer to hardware capable of supporting a protocol which is used by the host 60000, software installed in the hardware, or a signal transmission method.

When the memory system 70000 is connected to a host interface 6200 of the host 60000 such as a personal computer (PC), a tablet PC, a digital camera, a digital audio player, a cellular phone, console video game hardware or a digital set-top box, the host interface 6200 may perform data communication with the memory device 2200 through the card interface 7100 and the memory controller 2100 under control of a microprocessor (μP) 6100.

In accordance with embodiments of the present disclosure, memory cells may be selectively erased. Hence, threshold voltages of memory cells that are in an erase state and threshold voltages of memory cells that are in a program state may be prevented from overlapping each other. As a result, a memory device and a memory system having the memory device may be improved in reliability.

Various embodiments have been disclosed herein, and although specific terms are employed, they are used and are to be interpreted in a generic and descriptive sense and not for purpose of limitation. In some instances, as would be apparent to one skilled in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory device comprising:
a memory block including a plurality of memory cells; and
a peripheral circuit configured to perform a selective erase operation on the memory cells in a string basis,
wherein, during the selective erase operation, the peripheral circuit is configured to apply an erase voltage to a bit line coupled to a selected string of a plurality of strings coupled to different bit lines among a plurality of bit lines in the memory block and float unselected strings.

2. The memory device according to claim 1,
wherein the plurality of strings are coupled between the plurality of bit lines and a source line, and
wherein each of the strings comprises a drain select transistor, a plurality of memory cells, and a source select transistor.

3. The memory device according to claim 2, wherein a positive voltage is applied to the source line, and a floating voltage is applied to bit lines coupled to the unselected strings.

4. The memory device according to claim 3, wherein, after all of the source select transistors in the memory block are turned off and all of the drain select transistors in the memory block are turned on, drain select transistors in the unselected strings are turned off by the floating voltage.

5. The memory device according to claim 1, wherein an erase allowable voltage is applied to all word lines in the memory block.

6. A memory device comprising:
a memory block including a plurality of memory cells; and
a peripheral circuit configured to perform a selective erase operation on the memory cells in a memory cell basis,
wherein, during the selective erase operation, the peripheral circuit is configured to apply an erase allowable voltage to a selected word line among a plurality of word lines in the memory block, apply an erase voltage to a bit line coupled to a selected string among a plurality of strings coupled to different bit lines among a plurality of bit lines in the memory block, and float unselected word lines and unselected strings.

7. The memory device according to claim 6,
wherein the plurality of strings are coupled between the plurality of bit lines and a source line, and
wherein each of the strings comprises a drain select transistor, a plurality of memory cells, and a source select transistor.

8. The memory device according to claim 7, wherein a positive voltage is applied to the source line, and a floating voltage is applied to bit lines coupled to the unselected strings.

9. The memory device according to claim 8, wherein, after all of the source select transistors in the memory block are turned off and all of the drain select transistors in the memory block are turned on, drain select transistors in the unselected strings are turned off by the floating voltage.

10. A memory system comprising:
a memory device including a memory block; and
a memory controller configured to output a select erase command and an address of a selected memory cell, among a plurality of memory cells in the memory block,
wherein the memory device is configured to perform a selective erase operation in a string basis or a memory cell basis according to the select erase command and the address, and inhibit erasure of unselected memory cells by floating some word lines and strings, among all word lines and strings, in the memory block,
wherein the strings are coupled to different bit lines among a plurality of bit lines, and
wherein an erase voltage is applied to a bit line coupled to a selected string among the strings.

11. The memory system according to claim 10, wherein, during the selective erase operation in the string basis, an erase allowable voltage is applied to all word lines in the memory block, and a floating voltage is applied to bit lines coupled to unselected strings.

12. The memory system according to claim 10, wherein, during the selective erase operation in the memory cell basis, an erase allowable voltage is applied to a selected word line among the word lines, a floating voltage is applied to unselected word lines, and a floating voltage is applied to bit lines coupled to unselected strings.

* * * * *